US006542040B1

(12) United States Patent
Lesea (10) Patent No.: US 6,542,040 B1
(45) Date of Patent: Apr. 1, 2003

(54) PHASE-LOCKED LOOP EMPLOYING PROGRAMMABLE TAPPED-DELAY-LINE OSCILLATOR

(75) Inventor: Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/994,524

(22) Filed: Nov. 26, 2001

Related U.S. Application Data

(62) Division of application No. 09/563,155, filed on May 2, 2000, now Pat. No. 6,356,158.

(51) Int. Cl.[7] .............................. H03B 27/00; H03L 7/18
(52) U.S. Cl. .......................... 331/11; 331/1 A; 331/25; 331/57; 327/156; 327/157; 327/158; 327/159; 375/376
(58) Field of Search .............................. 331/57, 11, 1 A, 331/25, DIG. 2; 327/156, 157, 158, 159; 375/376

(56) References Cited

U.S. PATENT DOCUMENTS

| | | |
|---|---|---|
| 4,510,461 A | 4/1985 | Dickes et al. |
| 4,947,382 A | 8/1990 | Lesea |
| 5,374,904 A | 12/1994 | Ishibashi |
| 5,404,250 A | 4/1995 | Hase et al. |
| 5,475,344 A | 12/1995 | Maneatis et al. |
| 5,717,362 A | 2/1998 | Maneatis et al. |

OTHER PUBLICATIONS

R. Jacob Baker et al., "CMOS Circuit Design, Layout, and Simulation" IEEE Press Series on Microelectronic Systems, The Institute of Electrical and Electronics Engineers, Inc., New York, 1997, Chapter 19, pp. 373–424.

Howard C. Lang et al., "A Low Jitter 0.3–165 MHz CMOS PLL Frequency Synthesizer for 3 V/5 V Operation" 1997 IEEE Journal of Solid–State Ciruits, vol. 32, No. 4, Apr. 1997, pp. 582–586.

Sam Yinshang Sun, "An Analog PLL–Based Clock and Data Recovery Circuit with High Input Jitter Tolerance" IEEE Journal of Solid–State Ciruits, vol. 24, No. 2, Apr. 1989, pp. 325–330.

Virtex Data Sheet, "Virtex 2.5 V Field Programmable Gate Arrays", Nov. 9, 1998 (Version 1.1—Advance), XCell, the Quarterly Journal for Programmable Logic Users, Issue 31, First Quarter 1999, pp. 41–53.

*Primary Examiner*—Arnold Kinkead
(74) *Attorney, Agent, or Firm*—T. Lester Wallace; Edel M. Young (57) ABSTRACT

A phase-locked loop (PLL) having a wide range of oscillator output frequencies and a wide range of loop divider values is realizable in integrated form because the total capacitance of its loop filter is small. The PLL includes a first phase detector, a second phase detector, a programmable tapped-delay-line oscillator, a divide-by-M loop divider, and a programmable on-chip loop filter. The programmable filter is programmed to realize one of many loop filters. In a first step, oscillator output is fed back via the loop divider to the first phase detector. Oscillator frequency is decremented by changing tap selection inside the oscillator until the first phase detector determines that the frequency of the signal fed back via the loop divider (divide-by-M) is smaller than the frequency of an input signal. The tap control at which this frequency lock condition occurred, along with value M, is then used to determine which of the many loop filters will be used in a phase lock step. The programmable loop filter is controlled to realize the selected loop filter and the selected loop filter is switched into a control loop involving the second phase detector. The control loop controls the oscillator to achieve phase lock by varying a supply voltage supplied to the oscillator.

21 Claims, 8 Drawing Sheets

```
                    START
                      │
                      ▼
    ┌─────────────────────────────────────────┐
    │ CONTROL DELAY LINE TO FREQUENCY LOCK    │── 200
    └─────────────────────────────────────────┘
                      │
                      ▼
    ┌─────────────────────────────────────────┐
    │ USE INFORMATION FROM FREQUENCY LOCK STEP TO │── 201
    │         SELECT LOOP FILTER              │
    └─────────────────────────────────────────┘
                      │
                      ▼
    ┌─────────────────────────────────────────┐
    │ PHASE LOCK USING: 1) SELECTED LOOP FILTER, AND 2) │── 202
    │ DELAY LINE CONTROL USED IN FREQUENCY LOCK STEP    │
    └─────────────────────────────────────────┘
                      │
                      ▼
                    END
```

FIG. 3

| TABLE INPUTS | | TABLE OUTPUTS | |
|---|---|---|---|
| M | BIN[8:0] | FILTER | MOREGAIN |
| 0-15 | 000H-00FH | C=25 PF R=7.5 K | 0 |
| 0-15 | 010H-01FH | C=50 PF R=15 K | 0 |
| 0-15 | 020H-03FH | C=100 PF R=22.5 K | 0 |
| 0-15 | 040H-1FFH | C=200 PF R=30 K | 0 |
| 16-31 | 000H-00FH | C=25 PF R=7.5 K | 0 |
| 16-31 | 010H-01FH | C=50 PF R=15 K | 0 |
| 16-31 | 020H-03FH | C=100 PF R=22.5 K | 0 |
| 16-31 | 040H-1FFH | C=200 PF R=30 K | 0 |
| 32-127 | 000H-00FH | C=25 PF R=7.5 K | 1 |
| 32-127 | 010H-01FH | C=50 PF R=15 K | 1 |
| 32-127 | 020H-03FH | C=100 PF R=22.5 K | 1 |
| 32-127 | 040H-1FFH | C=200 PF R=30 K | 1 |
| 128-256 | 000H-00FH | C=25 PF R=7.5 K | 1 |
| 128-256 | 010H-01FH | C=50 PF R=15 K | 1 |
| 128-256 | 020H-03FH | C=100 PF R=22.5 K | 1 |
| 128-256 | 040H-1FFH | C=200 PF R=30 K | 1 |

FIG. 4

FIRST PHASE DETECTOR

FIG. 5

SECOND PHASE DETECTOR

FIG. 6

OSCILLATOR

FIG. 7

CONTROL BLOCK

FIG. 8

DIVIDER

FIG. 9

LOOP FILTER

PHASE-LOCKED LOOP EMPLOYING PROGRAMMABLE TAPPED-DELAY-LINE OSCILLATOR

This application is a Divisional of U.S. application Ser. No. 09/563,155 filed May 2, 2000, now U.S. Pat. No. 6,356,158.

TECHNICAL FIELD

This invention relates to phase-locked loops, and more particularly relates to phase-locked loops employing delay-line oscillators.

BACKGROUND INFORMATION

In transferring digital data in a system from a location on one integrated circuit to a location on another integrated circuit, it is often desired to convert the digital data from parallel form to serial form. Converting the digital data from parallel form to serial form allows the data to be transferred over a single conductor. In one example, a stream of multi-bit digital data values (each having N bits) is received over N conductors at a first clock rate FIN. This data is converted into serial form and is then transmitted over a single conductor at a faster clock rate FOUT equal to N times FIN. A circuit is therefore needed to take the first clock signal of frequency FIN and generate therefrom the faster clock signal of frequency FOUT (N times FIN) so that the faster clock signal is available to serialize the data and clock the serial data onto the single conductor. A phase-locked loop (PLL) is a circuit that can perform this frequency multiplying function.

Figure 1:
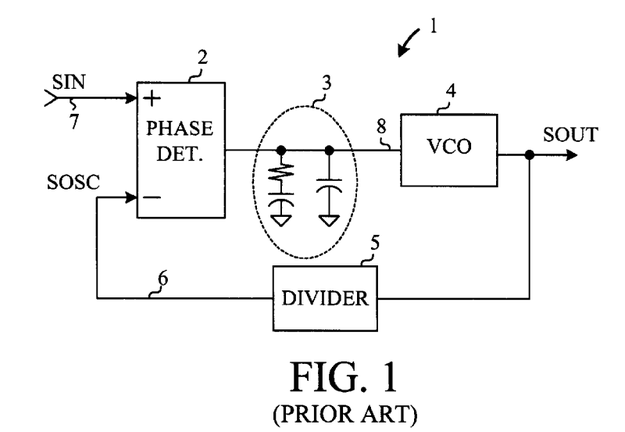
FIG. 1 (Prior Art) is a block diagram of a conventional phase-locked loop circuit.

FIG. 1 (Prior Art) is a block diagram of a PLL 1. PLL 1 includes a phase detector 2, a loop filter 3, a voltage controlled oscillator (VCO) 4, and a loop divider 5. The PLL works by detecting a difference in phase between a feedback signal SOSC on line 6 and an input signal SIN on line 7 and then adjusting the frequency FOUT of VCO output signal SOUT until the phase of the feedback signal SOSC matches the phase of the input signal SIN. If the phase of feedback signal SOSC lags the phase of input signal SIN, then an error signal on line 8 supplied to VCO 4 causes VCO 4 to increase the frequency of SOUT until the phase of the feedback signal SOSC matches the phase of input signal SIN. Similarly, if the phase of feedback signal SOSC leads the phase of input signal SIN, then the error signal on line 8 causes VCO 4 to decrease the frequency of SOUT until the phase of the feedback signal SOSC matches the phase of input signal SIN. When the PLL is "locked", the frequency and phase of the feedback signal SOSC will match the frequency and phase of the input signal SIN. Because loop divider 5 divides the signal SOUT by an integer value M to obtain the signal SOSC, the frequency of the signal SOUT is M times the frequency of the input signal SIN.

Accordingly it is seen that PLL 1 is usable to generate the faster serial clock in the parallel-to-serial conversion process described above. If the signal SIN is the parallel data clock of frequency FIN used to supply successive multi-bit data values, and divider 5 is set to divide by the number of bits M in each such multi-bit data value, then the signal SOUT is the faster clock signal of frequency M times FIN. Signal SOUT is then usable to serialize the parallel data and clock it onto the single conductor.

Blocks 2, 3 and 4 of the PLL of FIG. 1 are, however, not made of ideal circuitry. The electrical characteristics of these blocks vary over numerous operational conditions including operating frequency, divider value M, supply voltage VDD, temperature, and process variations. PLL 1 will, for example, only "lock" over a finite range of frequencies FOUT, given a particular value of M and a particular loop filter. Similarly, PLL 1 will only lock over a finite range of values for M, given a particular frequency FOUT and a particular loop filter. Also, PLL 1 will only lock with certain filter characteristics which yield certain dynamic loop responses, given a particular frequency FOUT and a particular value for M. A typical conventional PLL such as the PLL of FIG. 1 will not lock where FOUT varies by a factor in excess of ten, where M varies over a range from one to 256, and where the sum of all the capacitors in the loop filter have a capacitance of less than 250 picofarads.

A PLL is desired for use in a field programmable gate array (FPGA). If, for example, the PLL is used to do parallel-to-serial conversion, then the ranges of FOUT and M may vary widely from user design to user design. The ranges of FOUT and M are controlled by the user, and are generally dictated by the particular application to which the FPGA is put. It is therefore desired to provide on the FPGA a single PLL design that is usable over wider ranges of both FOUT and M than conventional PLLs, while providing all the elements of the loop filter on-chip in an economical fashion.

SUMMARY

A phase-locked loop (PLL) circuit includes a first phase detector, a second phase detector, a divide-by-M loop divider, a programmable tapped-delay-line oscillator, and a programmable on-chip loop filter. The programmable filter is programmable to realize one of many loop filters.

In a first step, a signal output by the oscillator is fed back (via the divide-by-M loop divider) to a first input of the first phase detector. An input signal SIN to be locked to is supplied to the second input of the first phase detector. The frequency of the oscillator output signal is then decremented by changing tap selection inside the oscillator. The frequency output by the oscillator is decremented in this manner under the control of the first phase detector until the first phase detector determines that the frequency of the signal fed back via the divider is smaller than the frequency of the input signal SIN. The PLL is then "frequency locked" with respect to input signal SIN.

The tap control at which this frequency lock condition occurred, along with value M, is then used to determine which of the many loop filters will be used in a subsequent phase lock step. This determination is made, in some embodiments, by a control block of the PLL. The programmable loop filter is then controlled to realize the selected loop filter and the selected loop filter is switched into a control loop involving the second phase detector. This control loop controls the frequency output by the oscillator to achieve phase lock by varying a supply voltage VSUP supplied to the oscillator. By using the tap control information from the frequency lock step to select the loop filter, a PLL having: 1) a wide oscillator output frequency range, 2) a wide range of divider values M, and 3) a small total loop filter capacitance is achieved.

In one embodiment, the PLL can phase lock: 1) where the oscillator outputs a signal having a frequency anywhere in the range of from 20 MHz to 400 MHz, 2) where divider value M is an integer selectable in the range of from one to 256, and 3) where the sum of all capacitances in the programmable loop filter is less than 250 picofarads. Achieving the wide ranges of oscillator frequency and divider value M while at the same time keeping the total loop filter capacitance under 250 picofarads facilitates economical integration of the PLL onto an integrated circuit, and more particularly onto a field programmable gate array.

In some embodiments, the tap control at which the frequency lock condition occurred, and the value M used during frequency lock, are also used to determine a gain of the second phase detector. In some embodiments, a control block of the PLL determines this gain and then controls the gain of the second phase detector accordingly during the phase control step via a gain control signal. In some embodiments, time to lock is improved by using a higher gain of the second phase detector for an initial period of the phase lock step and then switching to a lower gain for the remainder of the phase lock step.

Other structures and methods are disclosed in the detailed description below. This summary does not purport to define the invention. The invention is defined by the claims.

DETAILED DESCRIPTION

Figure 2:
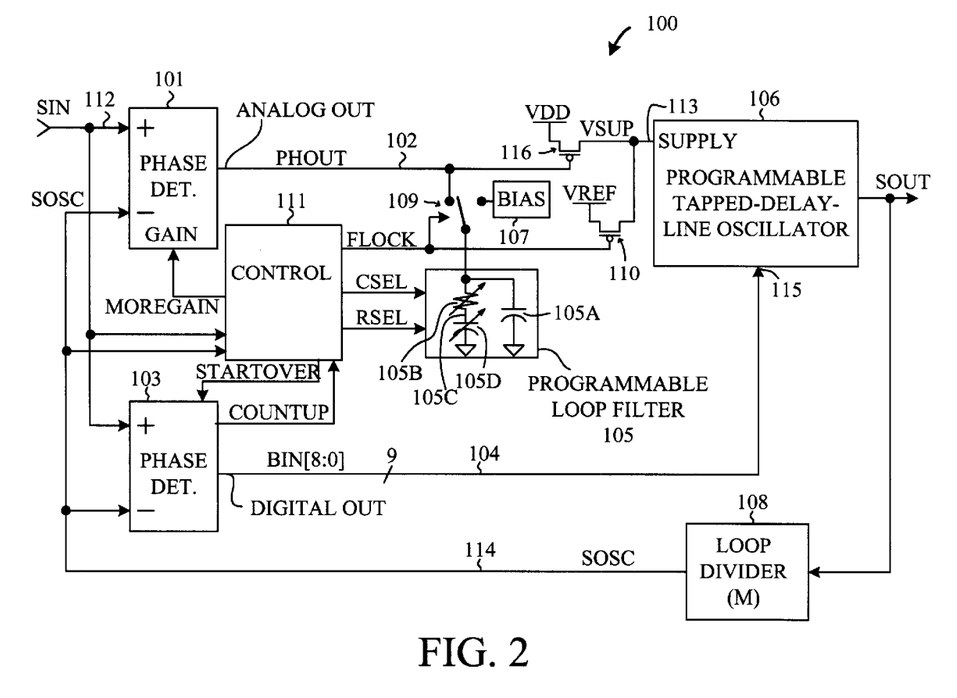
FIG. 2 is a block diagram of a phase-locked loop (PLL) circuit in accordance with an embodiment of the present invention.

FIG. 2 is a block diagram of a phase-locked loop (PLL) circuit 100 in accordance with one embodiment of the present invention. PLL 100 includes a first frequency and phase detector 103 (hereinafter referred to as a "phase detector") that outputs a digital signal BIN[8:0] on lines 104, a second frequency and phase detector 101 (hereinafter referred to as a "phase detector") that outputs an analog phase-error signal on line 102, a programmable loop filter 105, a programmable tapped-delay-line oscillator 106 that outputs a signal SOUT, a bias circuit 107, a loop divider 108 (divide-by-M), a first switch 109, a second switch 110, a third switch 116, and a control block 111. PLL 100 is, in one embodiment, realized on a field programmable gate array (FPGA) having an architecture of the Virtex family of FPGAs available from Xilinx, Inc. of San Jose Calif. For additional information on the architecture and operation of a Virtex FPGA, see: "Virtex Data Sheet", Xcell—The Quarterly Journal For Programmable Logic Users, issue 31, pages 41–53 (first quarter 1999). In an embodiment wherein PLL 100 is realized on such an FPGA, some or all of the circuitry in control block 111 may be realized using logic in configurable logic blocks (CLBs) of the FPGA. Verilog code or a hardware description language may be used to describe the function of the control block and to realize hardware capable of carrying out the function.

Operation of PLL 100 is explained in connection with the flowchart of FIG. 3. First (step 200), first phase detector 103 controls oscillator 106 to frequency lock onto an input signal SIN on line 112. During this step, digital signal FLOCK output by control block 111 is low (i.e. not "locked"). The supply voltage input lead 113 of oscillator 106 is coupled to a stable reference voltage VREF (for example, 1.2 volts) by second switch 110. A phase-error signal PHOUT output by second phase detector 101 is at a sufficiently high logic level so third switch 116 is nonconductive. Loop divider 108 is set to divide by a value M so that it divides signal SOUT by M and outputs a feedback signal SOSC onto line 114. This value M is, in this embodiment, a user-determined value for a particular user-specific application for the PLL.

First phase detector 103 decrements the frequency of output signal SOUT by incrementing the value BIN[8:0]. As it increments BIN[8:0], phase detector 103 detects which of signals SIN and SOSC has the higher frequency. As long as signal SOSC has a higher frequency, phase detector 103 continues to decrease the frequency output by oscillator 106. When phase detector 103 detects that the frequency of feedback signal SOSC is less than the frequency of input signal SIN, then PLL 100 is deemed to be "frequency locked". At this point, control block 111 causes signal FLOCK to transition high thereby indicating that frequency lock has been achieved. The value of BIN[8:0] at which frequency lock was achieved is maintained on the tap control digital input leads 115 of oscillator 106.

Next (step 201), information from the frequency lock step 200 is used to select a loop filter. In one embodiment, circuitry (not shown) in control block 111 uses the value of M and the value of BIN[8:0] at frequency lock to determine a loop filter to be used in a subsequent phase lock step.

Figure 4:
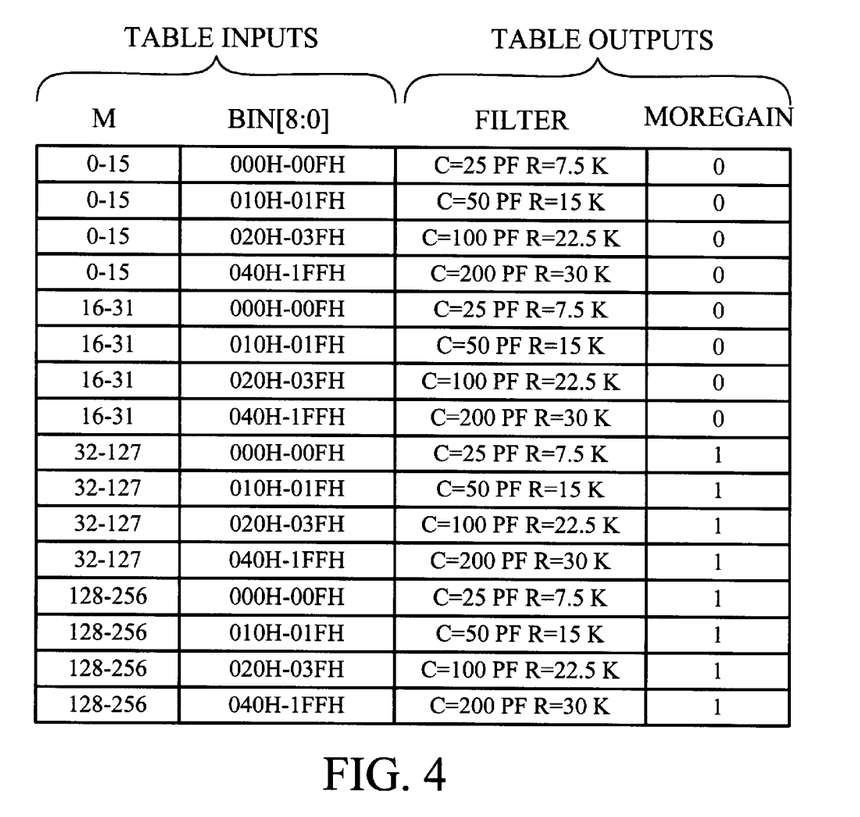
FIG. 4 is a table illustrating information usable to determine how to control programmable loop filter 105 of the PLL of FIG. 2 in a phase lock step.

FIG. 4 is a table of information usable by control block 111 in step 201 to select a loop filter as well as to select a gain of second phase detector 101. For each combination of value M and delay-line tap control value BIN[8:0], the table identifies a loop filter (determined by control values CSEL and RSEL that control programmable loop filter 105) and a gain setting for phase detector 101 (determined by control value MOREGAIN). After determining the proper loop filter, control block 111 controls programmable loop filter 105 via digital control lines CSEL and RSEL to select the proper loop filter.

Next (step 202), "phase lock" is achieved using the selected loop filter, the tap control value BIN[8:0] used in the frequency lock step, and the value M used in the frequency lock step. FLOCK being high causes first switch 109 to couple programmable loop filter 105 to line 102. Second phase detector 101, loop filter 105, oscillator 106, and loop divider 108 constitute a phase-locked loop that locks to input signal SIN. Rather than the reference voltage VREF being supplied onto the supply input lead 113 of oscillator 106, the phase-error signal PHOUT on line 102 controls third switch 116 to supply a supply voltage VSUP onto supply voltage input lead 113.

The magnitude of supply voltage VSUP on supply voltage input lead 113 is directly related to the frequency and phase of the signal SOUT output by oscillator 106 by the following means. Second phase detector 101 compares the phase of the feedback signal SOSC to the phase of the input signal SIN and outputs phase-error signal PHOUT onto line 102. Phase-error signal PHOUT, as conditioned by programmable loop filter 105, controls third switch 116 such that supply voltage VSUP is supplied onto supply voltage input lead 113 of oscillator 106.

If the phase of feedback signal SOSC lags the phase of input signal SIN, then phase-error signal PHOUT decreases the resistance of third switch 116 (used as a variable resistor) such that supply voltage VSUP on supply voltage input lead 113 causes oscillator 106 to increase the frequency of SOUT until the phase of the feedback signal SOSC matches the phase of input signal SIN. Similarly, if the phase of feedback signal SOSC leads the phase of input signal SIN, then phase-error signal PHOUT controls third switch 116 such that supply voltage VSUP on supply voltage input lead 113 causes oscillator 106 to decrease the frequency of SOUT until the phase of the feedback signal SOSC matches the phase of input signal SIN. Bias circuit 107 is provided to precharge the capacitance in programmable loop filter 105 during the frequency lock step so that this capacitance will be charged to approximately the average voltage of signal PHOUT (about 1.2 volts) at the beginning the phase lock step. If bias circuit 105 were not provided and the capacitance of the programmable loop filter 105 were not precharged, then coupling the programmable loop filter 105 onto line 102 at the beginning of the phase lock step would upset the nominal value of the phase-error signal PHOUT for a time until the capacitance of programmable loop filter 105 is charged. Precharging the capacitance of the programmable loop filter 105 using bias circuit 107 avoids this undesirable transient and thereby speeds achieving phase lock.

PLL 100 can phase lock: 1) where output signal SOUT has a frequency anywhere in the range of from 20 MHz to 400 MHz, 2) where divider value M is an integer in the range of from one to 256, and 3) where the sum of all the capacitances in the loop filter 105 is less than 250 picofarads. PLL 100 is capable of locking over these ranges for temperatures in the commercial temperature range (zero to 85 degrees Celsius), over supply voltage VDD ranges of from 1.4 volts to 1.6 volts (1.5 volts plus or minus approximately ten percent), and over standard process variations for a 0.18 micron CMOS process.

Figure 5:
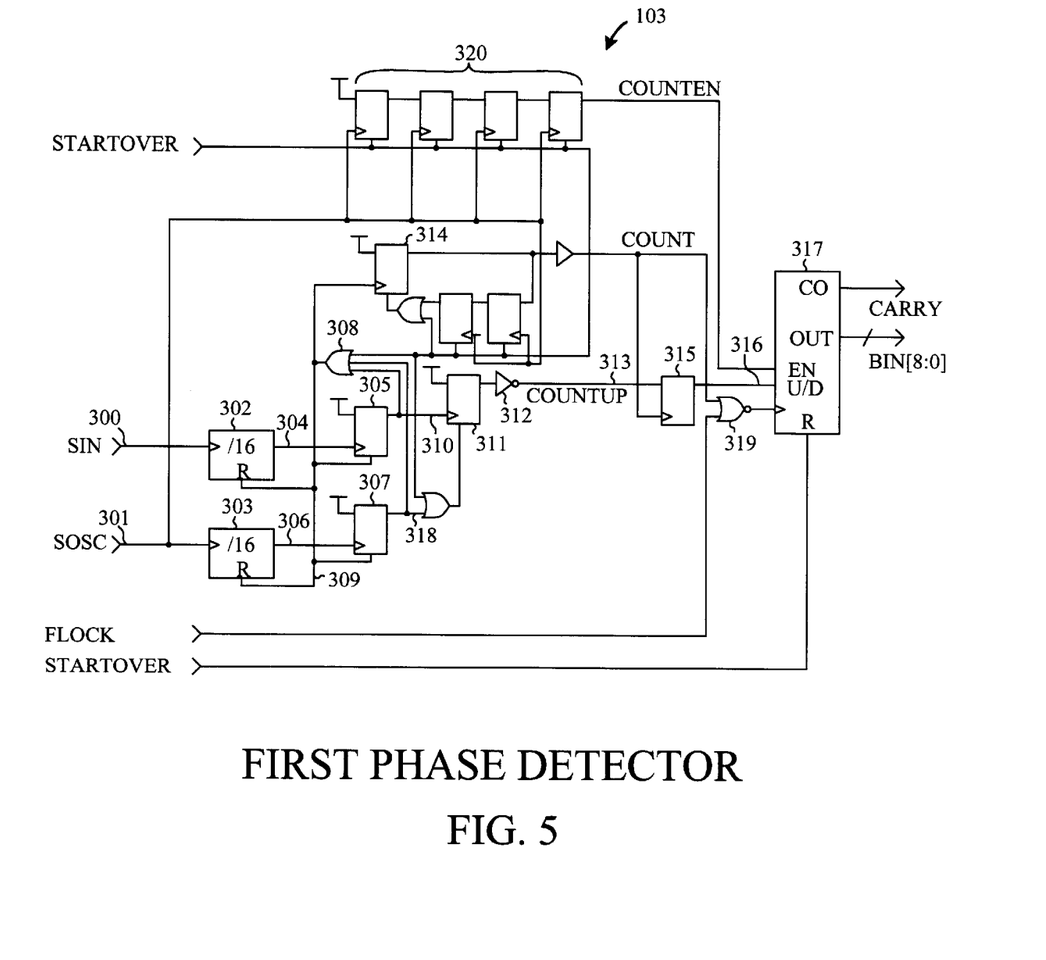
FIG. 5 is a circuit diagram of one particular implementation of phase detector 103 of the PLL of FIG. 2.

FIG. 5 is a circuit diagram of one particular implementation of phase detector 103 of PLL 100 of FIG. 2. Phase detector 103 receives input signal SIN on input lead 300 and feedback signal SOSC on input lead 301. A first divide by sixteen ripple counter 302 counts the number rising clock edges of input signal SIN and a second divide by sixteen ripple counter 303 counts the number of rising edges of feedback signal SOSC. Which ever one the two ripple counters 302 and 303 that reaches a count of sixteen first will output a clock edge to a corresponding flip-flop. If ripple counter 302 reaches a count of sixteen first, then a rising edge on line 304 will set flip-flop 305, whereas if ripple counter 303 reaches a count of sixteen first, then a rising edge on line 306 will set flip-flop 307. The setting of either of flip-flops 305 and 307 will cause both flip-flops 305 and 307 and counters 302 and 303 to be asynchronously reset via OR gate 308 and reset line 309.

If input signal SIN causes flip-flop 305 to be set, then the rising edge on line 310 will set flip-flop 311. Inverter 312 inverts this signal to be a low value of signal COUNTUP (i.e., don't count up) on line 313. The resetting of flip-flops 305 and 307 via line 309 also causes flip-flop 314 to be clocked and set. The resulting rising edge out of flip-flop 314 clocks the digital low COUNTUP value into flip-flop 315. This low value of COUNTUP is supplied to the UP/DOWN input lead 316 of counter 317. Counter 317 therefore decrements the value of BIN[8:0] that is supplied to oscillator 106 (see FIG. 2).

If, on the other hand, feedback signal SOSC causes flip-flop 307 to be set, then the rising edge on line 318 will reset flip-flop 311. Inverter 312 inverts this signal to be a high value of signal COUNTUP (i.e., count up) on line 313. Resetting of flip-flops 305 and 307 via line 309 also causes flip-flop 314 to be clocked and set. The rising edge out of flip-flop 314 clocks the digital high COUNTUP value into flip-flop 315. This high value of COUNTUP is supplied to the UP/DOWN input lead 316 of counter 317. Counter 317 therefore increments the value of BIN[8:0] that is supplied to oscillator 106 (see FIG. 2).

The signal STARTOVER is a reset signal supplied to phase detector 103 by control block 111. Prior to the frequency lock step (step 200 in FIG. 2), STARTOVER is high such that the phase lock detector 103 circuitry is reset. Counter 317 therefore starts the frequency lock step from a count of zero. After resetting phase detector 103, control block 111 removes the STARTOVER signal (STARTOVER goes low) such that phase detector 103 can compare the frequencies of SIN and SOSC as described above. During the frequency lock step, signal FLOCK is low (i.e., not locked). When frequency lock is achieved, control block 111 asserts FLOCK (i.e., FLOCK goes high), thereby freezing the count in counter 317 by blocking the clocking of counter 317 via OR gate 319. Flip-flops 320 are provided to delay the enabling of counter 317 for a few clock cycles after the removal of the reset signal STARTOVER.

Figure 6:
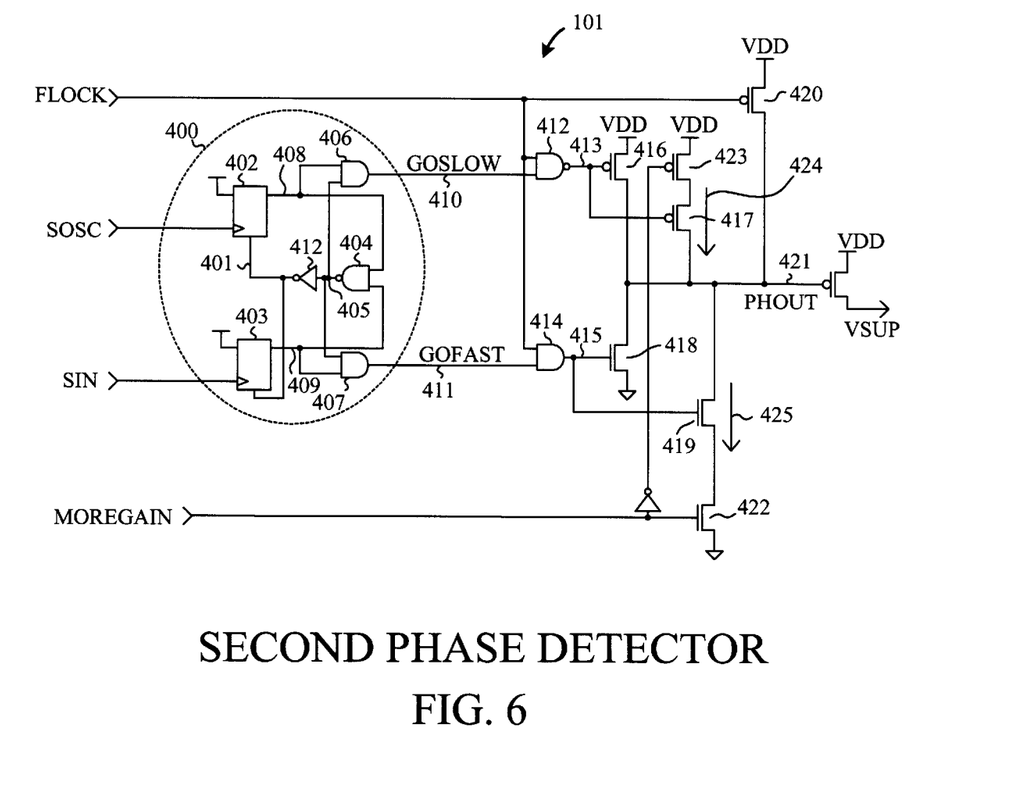
FIG. 6 is a circuit diagram of one particular implementation of phase detector 101 of the PLL of FIG. 2.

FIG. 6 is a circuit diagram of one particular implementation of second phase detector 101 of PLL 100 of FIG. 2. Second phase detector 101 includes a race detector 400. If a digital high is present on node 401, then flip-flops 402 and 403 will be reset (i.e., cleared). If flip-flops 402 and 403 are cleared, then they will output digital zeros to NAND gate 404, thereby removing the digital high on node 401. Flip-flops 402 and 403 will therefore be reset by an asynchronous clear on their respective clear inputs and then the reset signal will be removed. When the clear input on node 401 is removed (i.e., is low), a digital high will be present on node 405 at the output of NAND gate 404. This digital high signal is supplied to one input of each of AND gates 406 and 407. The digital high signal on one input of each of AND gates 406 and 407 enables a signal present on the other input to pass through these AND gates.

Input signals SIN and SOSC are periodic clock signals. If feedback signal SOSC clocks flip-flop 402 before input signal SIN clocks flip-flop 403, then flip-flop 402 outputs a rising edge on line 408, whereas flip-flop 403 outputs no such rising edge on line 409. This digital high signal on line 408 passes through enabled AND gate 406 and onto line 410 as a high value of signal GOSLOW. Such a high value of GOSLOW indicates that a rising edge of feedback signal SOSC was received before a rising edge of input signal SIN. Oscillator 106 is therefore controlled to "go slow". When a rising edge of input signal SIN is received, flip-flop 403 is clocked and a digital high is output onto line 409. For a brief period, this digital high passes through enabled AND gate 407 as a signal GOFAST on line 411 so that both signals GOSLOW and GOFAST are asserted. This condition only lasts for a very short period, however, because the simultaneous digital high values on lines 408 and 409 cause NAND gate 404 and inverter 412 to reset flip-flops 402 and 403. It is therefore seen that the duration that signal GOSLOW is high is related to the degree to which the rising edge of feedback signal SOSC leads the rising edge of the input signal SIN.

If, on the other hand, a rising edge of input signal SIN clocks flip-flop 403 before a rising edge of feedback signal SOSC clocks flip-flop 402, then a digital high is output onto line 409. This signal is conducted through enabled AND gate 407 and onto line 411 as a digital high value of signal GOFAST. This is appropriate because a rising edge of input signal SIN was received before a rising edge of feedback signal SOSC, indicating that the phase of feedback signal SOSC should be advanced (i.e., the frequency of SOSC should be increased).

When the next rising edge of feedback signal SOSC is received, then flip-flop 402 is clocked, a digital high is output onto line 408, and flip-flops 402 and 403 are reset. The duration that signal GOFAST is high is therefore related to the degree to which the rising edge of SOSC lags the rising edge of SIN.

Before PLL 100 is frequency locked, signal FLOCK is low. FLOCK being low causes NAND gate 412 to output a digital high onto P-channel transistor control line 413 regardless of the value of GOSLOW. FLOCK being low also causes AND gate 414 to output a digital low onto N-channel transistor control line 415 regardless of the value of GOFAST. The high value on P-channel transistor control line 413 causes P-channel transistors 416 and 417 to be nonconductive and the low value on N-channel transistor control line 415 causes N-channel transistors 418 and 419 to be nonconductive. FLOCK being low makes P-channel pull-up transistor 420 conductive thereby pulling the voltage on output lead 421 to supply voltage VDD before PLL 100 has frequency locked.

Once PLL 100 has frequency locked, FLOCK is asserted high, P-channel transistor 420 is made nonconductive and the signals GOSLOW and GOFAST are allowed to pass through gates 412 and 414. Signal GOSLOW passes through NAND gate 412 inverted because it is to turn on P-channel transistors 416 and 417.

Assuming that control block 111 has asserted digital signal MOREGAIN (i.e., MOREGAIN is high), then a digital high is supplied to the gate of N-channel pull-down transistor 422 and a digital low is supplied to the gate of P-channel pull-up transistor 423. These two transistors 422 and 423 are therefore conductive. If signal GOSLOW is asserted (i.e., is high), then P-channel transistors 416, 417 and 423 are conductive thereby sourcing current from voltage supply VDD onto output lead 421. The amount of charge (current over time) sourced by phase detector 101 to loop filter 105 (see FIG. 2) depends upon the duration of time that GOSLOW is high. Similarly, if signal GOFAST is asserted (i.e., is high), then N-channel transistors 418, 419 and 422 are conductive thereby sinking current from output lead 421 to ground. The amount of charge (current over time) phase detector 101 sinks from loop filter 105 (see FIG. 2) depends upon the duration of time that GOFAST is high.

During the brief period that both GOSLOW and GOFAST are high when race detector 400 is being reset, a current path from VDD to ground exists through conductive transistors 416, 417, 423, 418, 419 and 422. A current may therefore shunt through the phase detector 101 from VDD to ground. This current will, however, only flow for the extremely short period of time that that race detector 400 is being reset. It is desirable to have a small time when both GOSLOW and GOFAST are high to eliminate a possible "dead-zone" where no output results from a phase error.

Control block 111 can control phase detector 101 to have a lower gain by deasserting the MOREGAIN signal (setting MOREGAIN to a digital low). If MOREGAIN is low, then transistors 422 and 423 are made nonconductive. Accordingly, current paths 424 and 425 through transistors 417 and 419 cut, thereby reducing the current sourcing and current sinking capability of phase detector 101. The P-channel pull-up transistors and N-channel pull-down transistors are sized so that phase detector 101 sinks or sources approximately plus or minus 30 microamperes in the low gain mode (MOREGAIN is low) and so that phase detector 101 sinks or sources approximately plus or minus 100 microamperes in the high gain mode (MOREGAIN is high).

Third switch 116 is included in FIG. 6 because third switch 116 is considered part of the second phase detector 101. During phase lock, second phase detector 101 outputs a supply voltage VSUP onto supply voltage input lead 113 of oscillator 106.

Figure 7:
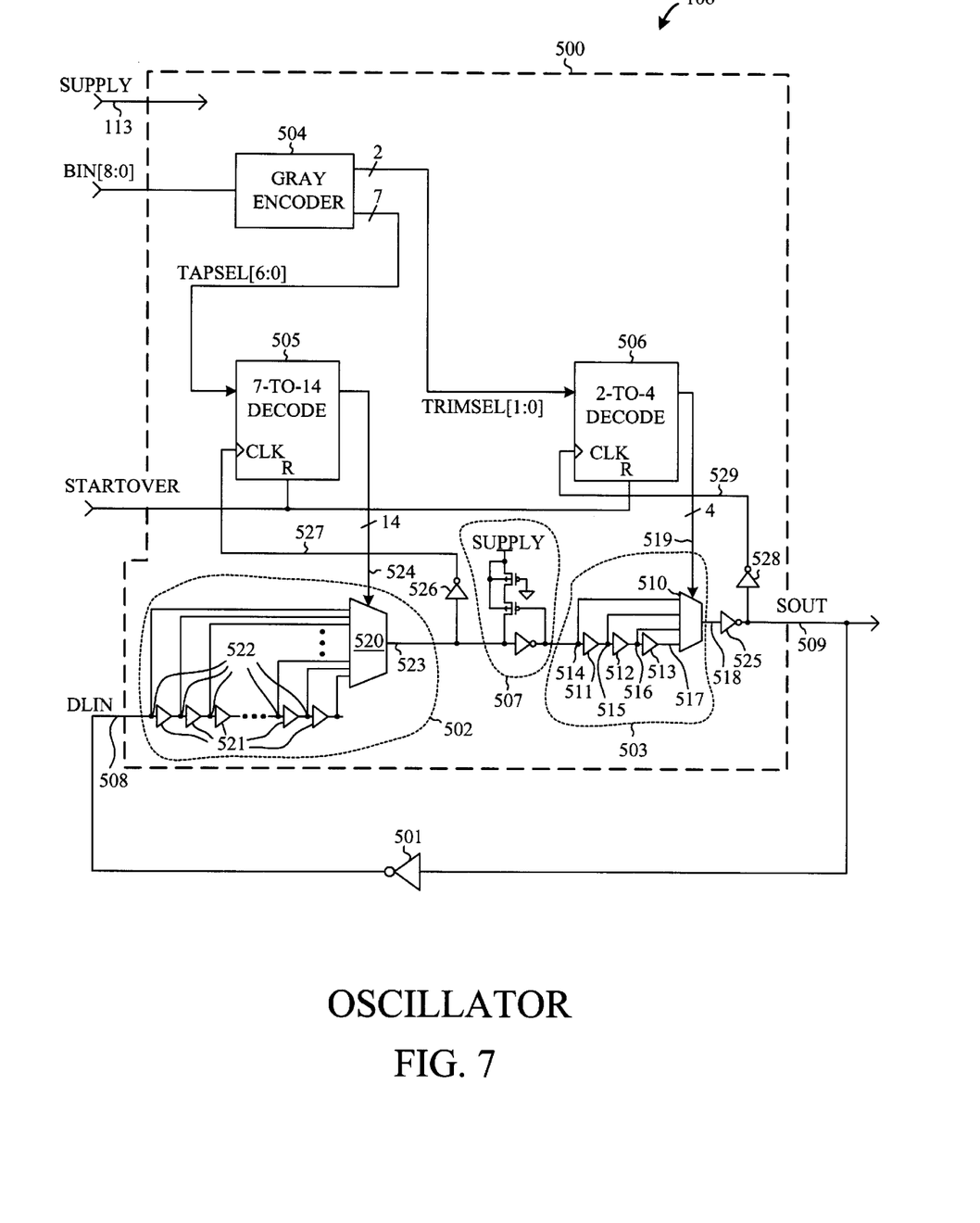
FIG. 7 is a circuit diagram of one particular implementation of programmable tapped-delay-line oscillator 106 of the PLL of FIG. 2.

FIG. 7 is a circuit diagram of one particular implementation of programmable tapped-delay-line oscillator 106 of PLL 100 of FIG. 2. Oscillator 106 includes a programmable tapped-delay-line 500 and an inverter 501. Programmable tapped-delay-line 500 in turn includes two programmable tapped-delay-lines 502 and 503, a gray encoder 504, a seven-to-fourteen decoder 505, a two-to-four decoder 506, and a level shift circuit 507. Programmable tapped-delay-line 500 has a delay-line input lead DLIN 508 and a delay-line output lead SOUT 509. A signal output at the programmable delay-line output lead SOUT is inverted by inverter 501 and fed back to the programmable delay-line input lead DLIN, thereby forming a ring oscillator. The frequency of the oscillating signal is changed by changing the number of inverters in the ring and/or by changing the supply voltage VSUP on supply voltage input lead 113. Each of the non-inverting buffers illustrated in the two delay-lines 502 and 503 actually includes two standard CMOS inverters. The output lead of the first inverter is coupled to the input lead of the second inverter. The supply voltage input lead of each of these two inverters is coupled to supply voltage input lead 113 of oscillator 106.

Programmable delay-line 503 includes a 4-to-1 multiplexer 510 and three non-inverting buffers 511–513. The propagation delay from the input lead to the output lead of each of the three non-inverting buffers 511–513 is approximately 100 picoseconds. Programmable delay-line 503 couples one of taps 514–517 to multiplexer output lead 518, the tap being determined by a four-bit digital value on select input leads 519.

Programmable delay-line 502 includes a 512-to-1 multiplexer 520 and five hundred and eleven non-inverting buffers 521. Such a wide multiplexer is advantageously built in stages, for example using a first stage with 128 four-input tristate buffers, followed by a second stage having 32 4-input multiplexers, a third stage having 8 4-input multiplexers, a fourth stage having two 4-input multiplexers, and finally a fifth stage having one 2-input multiplexer. The total delay for five stages at 75 picoseconds per stage is only 375 picoseconds. If the device is operating at 333 to 500 MHz, the clock period is 2–3 nanoseconds, and the 375 picosecond delay of the multiplexer tree is easily accommodated.

The propagation delay from the input lead to the output lead of each of the non-inverting buffers 515 is approximately 400 picoseconds. Programmable delay-line 502 couples one the taps 522 between the various buffers 521 to multiplexer output lead 523, the tap being determined by a fourteen-bit digital value on select input leads 524.

Inverter 525 is included in the signal path of delay-line 500 between DLIN 508 and SOUT 509 to offset the inverting effect of level shift circuit 507. The total delay from input lead DLIN 508 to output lead SOUT 509 is programmable in 100 picosecond increments from approximately 1250 picoseconds to greater than 25,000 picoseconds. Gray encoder 504 translates BIN[8:0] into values TRIMSEL[1:0] and TAPSEL[6:0] such that, as the delay of programmable delay-line 500 is increased or decreased by a 100 picosecond increment: 1) only one bit of two-bit value TRIMSEL[1:0] changes at a time, and 2) only one bit of seven-bit value TAPSEL[6:0] changes at a time. To prevent introduction of glitches into the delay-line 502 when tap selection changes, the inputs to decoder 505 are latched such that the outputs of decoder 505 only change after a signal edge has just passed through the delay-line 502. A signal edge on multiplexer output 523 latches decoder 505 via inverter 526 and line 527. Similarly, the inputs to decoder 506 are latched such that the outputs of decoder 506 only change after a signal edge has just passed through the delay-line 503. A signal edge on multiplexer output lead 518 latches decoder 506 via inverter 528 and line 529.

The power supply input lead (not shown) of each of the inverters of the non-inverting buffers of delay-lines 502 and 503 is coupled to supply voltage input lead 113. Decreasing supply voltage VSUP on lead 113 causes the delay from DLIN to SOUT 509 to increase. Conversely, increasing supply voltage VSUP on lead 113 causes the delay from DLIN 508 to SOUT 509 to decrease. Changes in the delay of delay-line 500 have a substantially linear relationship with respect to changes in supply voltage VSUP over a 1.0 volt to 1.3 volt supply voltage range. A change in supply voltage VSUP of 0.2 volts results in approximately a two-to-one change in frequency. Second phase detector 101 and loop filter 105 (see FIG. 2) control supply voltage VSUP on supply voltage input lead 113 to be within this 1.0 volt to 1.3 volt voltage range.

Figure 8:
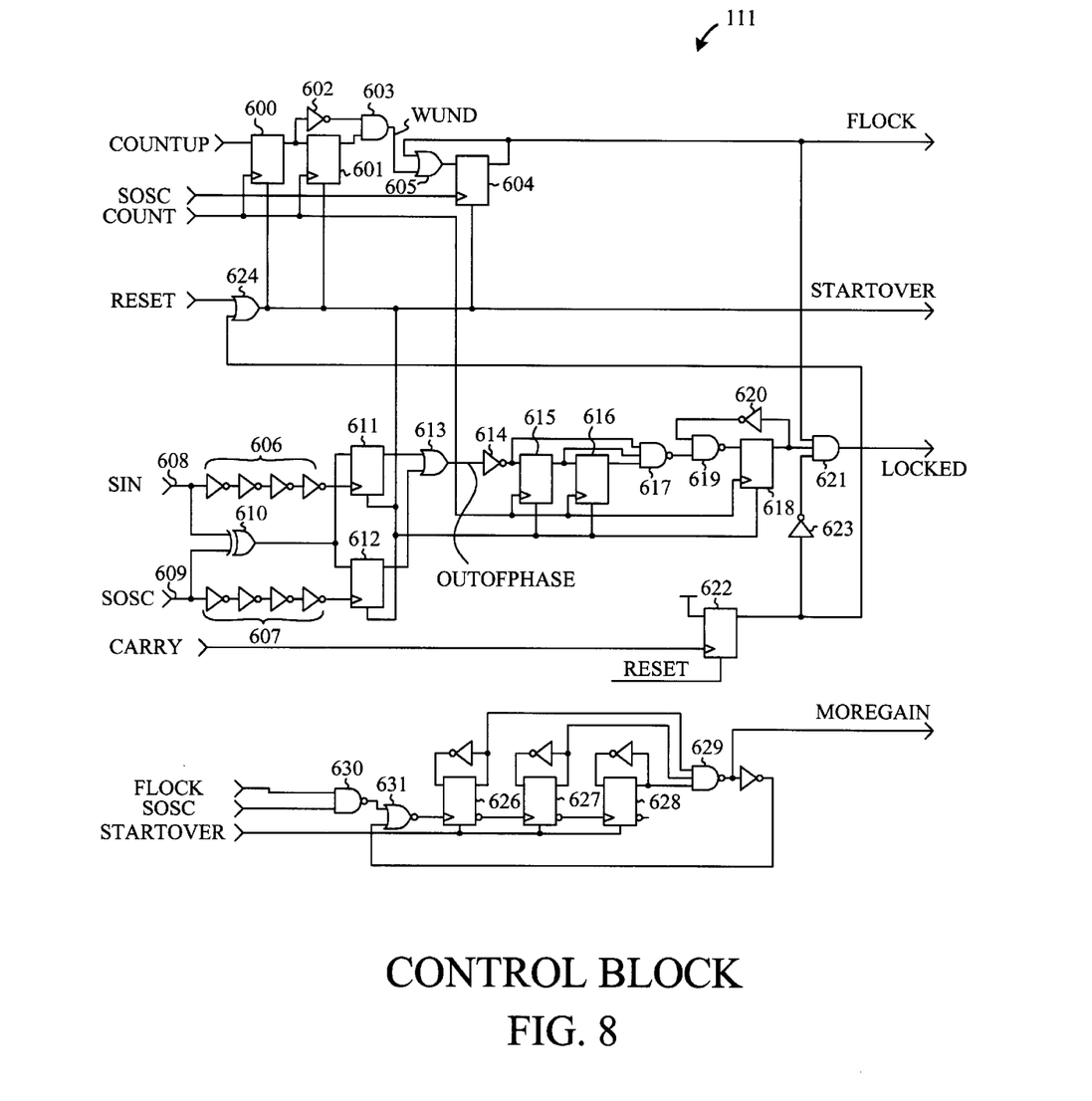
FIG. 8 is a circuit diagram of one particular implementation of part of control block 111 of the PLL of FIG. 2.

FIG. 8 is a circuit diagram of one particular implementation of control block 111 of PLL 100 of FIG. 2. Signal COUNTUP in FIG. 8 is the signal COUNTUP on line 313 in FIG. 5. As explained above in connection with FIG. 5, phase detector 103 compares the frequency of feedback signal SOSC to the frequency of input signal SIN. If feedback signal SOSC has a higher frequency, then phase detector 103 increments BIN[8:0] and repeats the comparison. Frequency lock occurs when the feedback signal SOSC is first detected to have a lower frequency than input signal SIN. In the control block of FIG. 8, the COUNTUP signal is clocked through two flip-flops 600 and 601. If the value of COUNTUP was high (i.e. true) and then changes to low (i.e., false), then flip-flop 601 will output a digital high and flip-flop 600 will output a digital low. This condition is detected by inverter 602 and AND gate 603. The signal WUND ("was up now down") output by AND gate 603 is latched into flip-flop 604. Once flip-flop 604 is set, a digital logic high signal is fed back to the flip-flop's data input by OR gate 605. This fed back digital logic high signal keeps the flip-flop 604 set until it is asynchronously cleared. The output of flip-flop 604 is the signal FLOCK indicating frequency lock has been achieved.

After frequency lock has been achieved, the feedback signal SOSC is compared to input signal SIN to determine if phase lock has been achieved. Control block 111 of FIG. 8 tests to determine whether a rising edge of signal SIN and a rising edge of signal SOSC occur within the same "window" of time. If the rising edges occur within the same "window" for several consecutive tests, then the signals are determined to be in phase (i.e., phase "locked"). The size of the test "window" depends upon the propagation delay through inverter chain 606 and inverter chain 607. If the propagation delay is larger, then the window is larger. Consider the situation in which a rising edge of signal SIN is received on node 608 and then a rising edge of signal SOSC is received on node 609, but the rising edge of signal SOSC is present on node 609 before the rising edge of signal SIN reaches the clock input lead of flip-flop 611. Exclusive OR gate 610 outputs a digital low if the signals on nodes 608 and 609 have the same logic levels. Because the signal SOSC transitions high before the rising edge of signal SIN propagates to the clock input of flip-flop 611, exclusive OR gate 610 is outputting a digital low when flip-flop 611 is clocked. Exclusive OR gate 610 continues to output a digital low until the rising edge of signal SOSC reaches the clock input lead of flip-flop 612. Both flip-flops 611 and 612 are therefore clocked to output digital low values. If both of flip-flops 611 and 612 output digital low values, then OR gate 613 outputs a digital low OUTOFPHASE signal (indicating the signals are in phase).

If, on the other hand, a rising edge of signal SIN on node 608 reaches the clock input lead of flip-flop 611 before the rising edge of signal SOSC reaches node 609, then exclusive OR gate 610 will be outputting a digital high when flip-flop 611 is clocked. Flip-flop 611 will then output a digital high to OR gate 613 and the value of signal OUTOFPHASE will be a digital high (indicating the signals are out of phase).

The circuitry including inverter 614, flip-flops 615 and 616, and NAND gate 617 detects if the signal OUTOFPHASE was low (i.e., in phase) for three consecutive COUNT clocks. If OUTOFPHASE is low for three consecutive COUNT clocks, then NAND gate 617 will output a digital low. Flip-flop 618, having been reset, is outputting a digital low. The value on the upper input lead of NAND gate 619 is therefore a digital high by virtue of inverter 620. The digital low on the lower input lead of NAND gate 619 causes NAND gate 619 to output a digital high. When flip-flop 618 is clocked by signal COUNT, flip-flop 618 is set. Once set, flip-flop 618 remains set because inverter 620 outputs a digital low to the upper input lead of NAND gate 619. NAND gate 619 therefore supplies a digital high to the data input lead of flip-flop 618 regardless of the digital value on the lower input lead of NAND gate 619. The output of flip-flop 618 is gated through AND gate 621 to become the signal LOCKED. The FLOCK signal is supplied to one input lead of AND gate 621 to prevent the LOCKED signal from indicating the locked condition unless frequency lock has been achieved.

If counter 317 (see FIG. 5) has incremented so far that is overflows (generated a carryout signal), then the PLL 100 is deemed not to be phase locked and PLL 100 is reset so that it can attempt to lock once more. The signal CARRY is therefore supplied via flip-flop 622 and inverter 623 to an input of AND gate 621. If the signal CARRY is high (i.e., a counter overflow), then a digital low is supplied to an input lead of AND gate 621 thereby preventing the LOCKED signal from going high and indicating the locked condition. The carry signal output by flip-flop 622 causes a reset of the PLL 100 by causing the signal STARTOVER to be asserted. A digital high signal output by flip-flop 622 is supplied to an input of OR gate 624 such that OR gate 624 asserts signal STARTOVER in the counter overflow condition.

Figure 3:
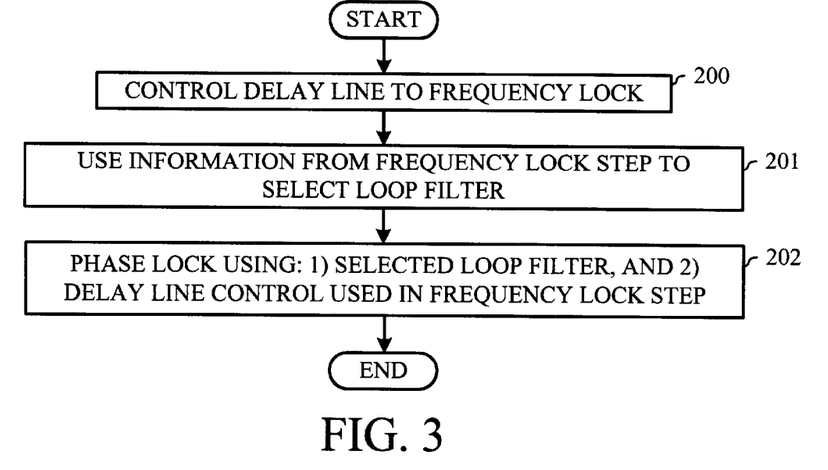
FIG. 3 is a flowchart illustrating an operation of the PLL of FIG. 2.

In one embodiment, phase lock is accelerated by using a larger gain setting of second phase detector 101 for the first few (for example, seven) SOSC clock cycles of the phase lock step 202 of FIG. 3 and then using a smaller gain setting for the remainder of the phase lock step 202. Flip-flops 626–628 form a ripple counter. Initially these flip-flops are in the reset condition such that NAND gate 629 asserts the MOREGAIN signal high. If frequency lock has been achieved, signal FLOCK is a digital high. The feedback signal SOSC therefore passes through NAND gate 630 and NOR gate 631 and clocks flip-flop 626 to increment the ripple counter. NAND gate 629 detects when the ripple counter count reaches seven (all ones). NAND gate 629 then deasserts the MOREGAIN signal, thereby reducing the gain of second phase detector 101 after seven SOSC clock cycles.

Figure 9:
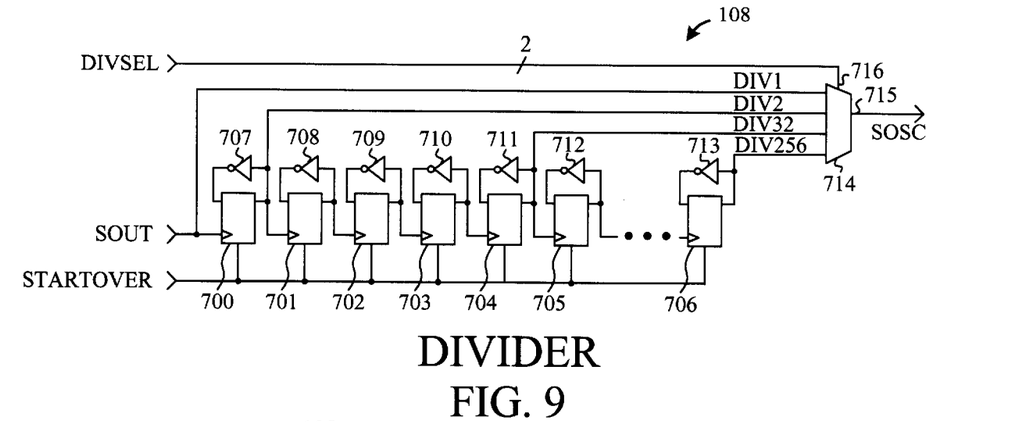
FIG. 9 is a circuit diagram of one particular implementation of loop divider 108 of the PLL of FIG. 2.

FIG. 9 is a circuit diagram of one particular implementation of programmable divider 108 of PLL 100 of FIG. 2. The particular divider 108 of FIG. 9 can divide by one the four M values: 1, 2, 32, or 256. Flip-flops 700–706 and the feedback inverters 707–713 form an eight-bit ripple counter that is clocked by PLL output signal SOUT. Multiplexer 714 couples either the signal SOUT, or the signal SOUT divided by 2 as output by flip-flop 700, or the signal SOUT divided by 32 as output by flip-flop 704, or the signal SOUT divided by 256 as output by flip-flop 706 to multiplexer output lead 715. Which one of the four signals that is coupled to output lead 715 is determined by the two-bit digital signal DIVSEL supplied to the select input leads 716 of multiplexer 710. In the presently described embodiment, the value of signal DIVSEL is determined by the user of PLL 100.

Although a ripple counter is illustrated in the embodiment of FIG. 9, a synchronous counter is used in another embodiment. Use of a synchronous counter may minimize phase error at lock by reducing the signal SOUT to SOSC delay of divider 108.

Figure 10:
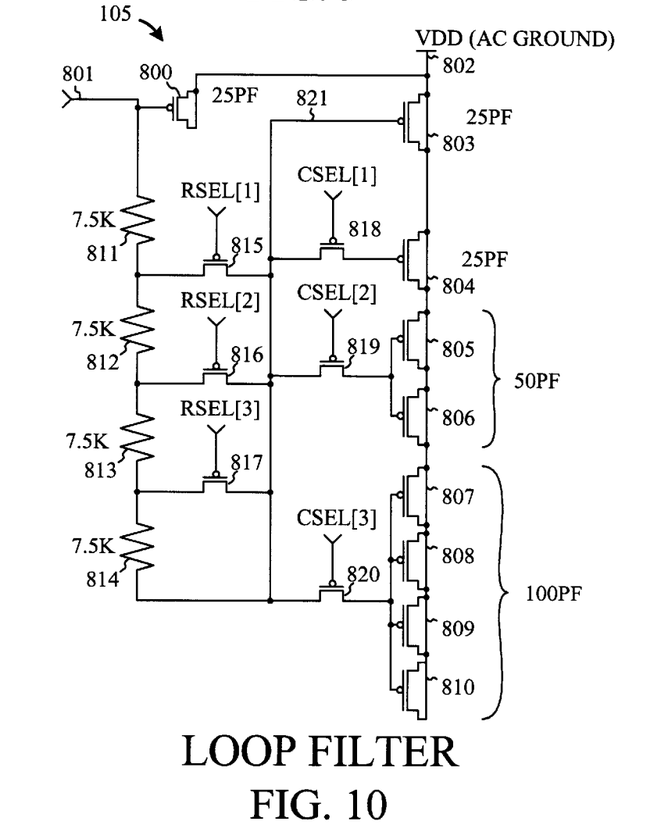
FIG. 10 is a circuit diagram of one particular implementation of loop filter 105 of the PLL of FIG. 2.

FIG. 10 is a circuit diagram of one particular on-chip implementation of programmable loop filter 105 of PLL 100 of FIG. 2. The supply voltage VDD in this circuit is an AC ground at node 802. P-channel transistor 800 provides a 25 picofarad capacitance between loop filter input lead 801 and AC ground at node 802. This capacitance filters out ripple introduced onto line 102 by second phase detector 101. Transistor 800 corresponds to capacitor 105A in FIG. 2.

P-channel transistors 803–810, resistors 811–814, and select transistors 815–820 form the remainder of programmable loop filter 105. The characteristics of this portion of filter 105 determine system dynamic response characteristics (for example, control loop damping factor, overshoot and undershoot). Resistors 811–814 and select transistors 815–817 in FIG. 10 correspond to variable resistor 105B in FIG. 2. Node 821 in FIG. 10 corresponds to node 105C in FIG. 2. P-channel transistors 803–810 and select transistors 818–820 of FIG. 10 correspond to variable capacitor 105D in FIG. 2.

If none of the select signals RSEL[1], RSEL[2] and RSEL[3] is asserted (i.e., all are digital low), then input lead 801 is coupled to node 821 by 30 k ohms of resistance. If RSEL[3] is asserted and RSEL[1] and RSEL[2] are not asserted, then input lead 801 is coupled to node 821 by 22.5 k ohms of resistance. If RSEL[2] is asserted and RSEL[1] and RSEL[3] are not asserted, then input lead 801 is coupled to node 821 by 15 k ohms of resistance. If RSEL[1] is asserted and RSEL[2] and RSEL[3] are not asserted, then input lead 801 is coupled to node 821 by 7.5 k ohms resistance. In the embodiment of FIG. 2, at most one of RSEL[1], RSEL[2] and RSEL[3] is asserted at a time.

If none of the select signals CSEL[1], CSEL[2] and CSEL[3] is asserted (i.e., digital low), then 25 picofarads of capacitance is coupled between node 821 and AC ground at node 802. If all of CSEL[1], CSEL[2] and CSEL[3] are asserted, then 200 picofarads of capacitance is coupled between node 821 and AC ground at node 802. In the embodiment of FIG. 2, any number of the select signals CSEL[1], CSEL[2] and CSEL[3] can be asserted at a given time to control the capacitance between node 821 and AC ground at node 802.

Node 802 is AC grounded to supply voltage VDD rather than to ground potential to provide noise immunity against undesirable noise on supply voltage VDD. Third switch 116 in FIG. 2 is a P-channel transistor that has its source coupled to supply voltage VDD. Noise in supply voltage VDD does not, however, unduly affect the source-to-gate voltage of third switch 116 because transistors 800 and 803–810 in loop filter 105 are AC grounded to supply voltage VDD. Because transistors 800 and 803–810 are AC grounded to VDD, changes in VDD on transistors 800 and 803–810 adjust the gate voltage on third switch 116 so as to counteract the effect on source-to-gate voltage due to those same changes in supply voltage VDD on the source of third switch 116. Transistors 800 and 803–810 are realized as P-channel transistors rather than as N-channel transistors so that they can be AC grounded to supply voltage VDD.

A metal ground ring and a metal VDD ring surround the programmable loop filter of FIG. 10 as well as the driver transistors 416, 417, 418, 419, 420, 423 and 425 of FIG. 6. Each of transistors 800 and 803–810 has a channel region 20,000 microns wide and 0.18 microns long and provides about 25 picofarads of capacitance. The total capacitance of all of transistors 800 and 803–810 of loop filter 105 is therefore less than 250 picofarads. The total die area consumed by all of these P-channel transistors 800 and 803–810 is less than 50,000 square microns thereby making integration of programmable loop filter 105 on the same die as the remainder of PLL 100 economically realistic in many situations.

Figure 11:
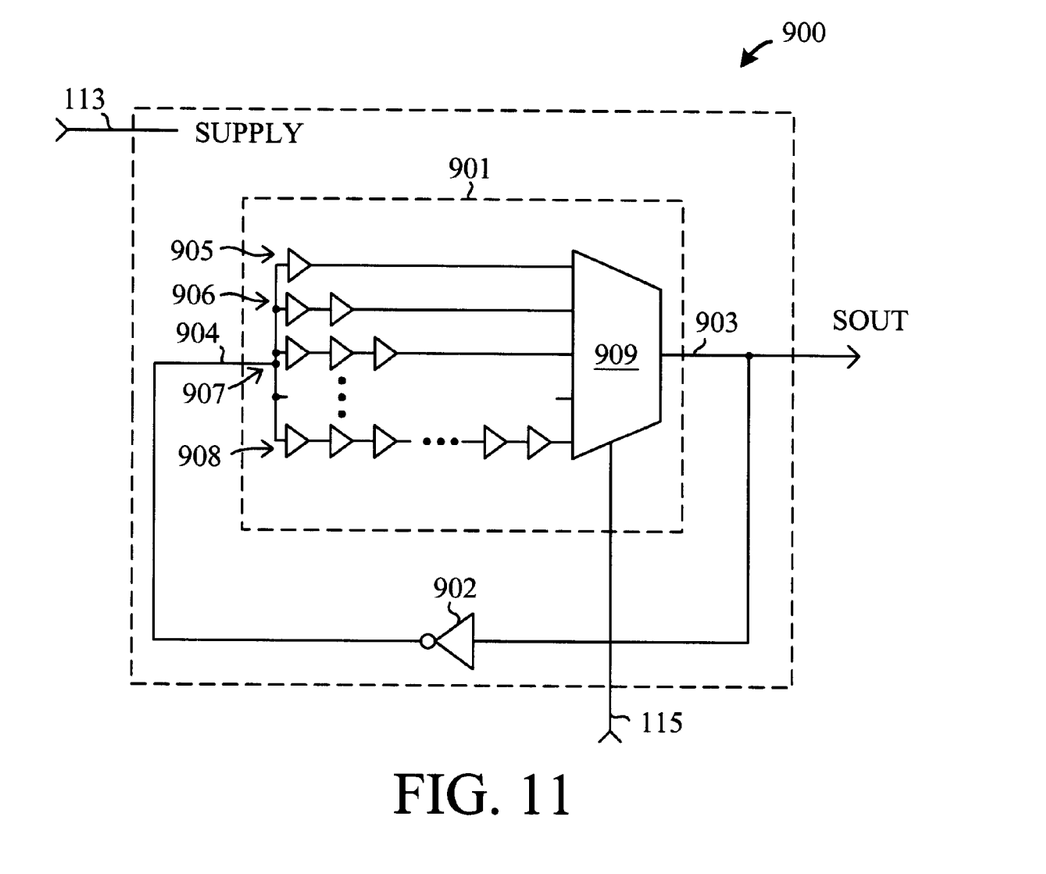
FIG. 11 is a circuit diagram of another implementation of a programmable tapped-delay-line oscillator.

FIG. 11 is another implementation of a programmable tapped-delay-line oscillator 900 in accordance with the present invention. Oscillator 900 includes a programmable tapped-delay-line 901 and an inverter 902. Data output lead 903 of programmable delay-line 901 is coupled to the input lead of inverter 902 and the output lead of inverter 902 is coupled to data input lead 904 of programmable delay-line 901 to form a ring oscillator. Programmable delay-line 901 includes a plurality of delay lines 905–908 and a multiplexer 909. Each delay line has an input lead and an output lead. The input leads of the delay lines are coupled together at input lead 904. The output lead of each respective delay-line is coupled to a corresponding one of the data input leads of multiplexer 909. Each of delay lines 905–908 has a different number of non-inverting buffers. Each of these non-inverting buffers includes two series-connected inverters, the supply voltage leads of which are coupled to supply voltage input lead 113. Multiplexer 909 couples the output lead of a selected one of delay lines 905–908 to data output lead 903, the particular delay line selected being determined by a digital tap select value on tap select input leads 115. Course adjustment of the frequency of output signal SOUT is accomplished by changing the digital tap select value on tap select input leads 115. Fine adjustment of the frequency of output signal SOUT is accomplished by adjusting the magnitude of supply voltage VSUP on supply voltage input lead 113.

Although the programmable tapped-delay-line oscillators of FIGS. 7 and 11 involve inverters as the basic building blocks of the delay lines, this need not be the case. Circuits other than inverters may be used. In some embodiments, delay lines of different propagation delays are implemented by using identical driver circuits to drive capacitive loads of different magnitudes. Alternatively, the delay lines can be realized as different lengths of metal interconnect, the fine frequency adjustment of the oscillator coming from adjusting the supply voltage powering the feedback inverter.

In some embodiments, control block 111 has a test window of a programmable size. For example, a first programmable delay line is used in place of inverter chain 606 and a second programmable delay line is used in place of inverter chain 607. In one embodiment, each of these delay lines has the structure of delay line 503 of FIG. 7. One of four test window sizes is selected by selecting a two-bit control value on the select input leads of the multiplexers in these two delay lines. Test window size is selected to be dependent upon oscillator frequency such that ever smaller test window sizes are selected for ever larger oscillator frequencies.

The range of value M over which loop divider 108 operates can be expanded to the range of from one to more than 1024. Values in the table of FIG. 4 are determined for an M value of 1024 by evaluating the loop transfer function for the phased-lock loop given an M value of 1024, an oscillator frequency that corresponds to a selected value of BIN[8:0], selected loop filter R and C values, a gain of second phase detector 101 that corresponds to a selected MOREGAIN value, and an oscillator gain that would be observed with the above values. The resulting loop response is compared to a desired loop response (i.e., desired damping factor, desired undershoot, desired overshoot). If the loop response is acceptable, then a row is added to the table for the 1024 M value and the selected BIN[8:0] value, the loop filter R and C values being placed in the third column of the table for the new row, the value of MOREGAIN being placed in the fourth column of the table for the new row.

Although the present invention is described in connection with certain specific embodiments for instructional purposes, the present invention is not limited thereto. The second phase detector need not control the oscillator during the phase lock step by controlling a supply voltage supplied to the oscillator. Rather, the second phase detector may control the oscillator by controlling a supply current supplied to oscillator. Alternatively, the second phase detector may control the oscillator by a pulse width modulation scheme. The oscillator may be controlled via differentially driven signals. Although the output frequency of oscillator 106 in the above described embodiments is decremented during the frequency lock step, other schemes for achieving frequency lock are possible. In some embodiments, the output frequency of the oscillator is incremented until the feedback signal SOSC has a higher frequency than input signal SIN. Tap control values need not be incremented or decremented one tap at a time, rather in some embodiments tap control values are changed so as to carry out faster convergence on a tap control value corresponding to frequency lock. A binary search scheme is employed to change tap control values during the frequency lock step in some embodiments. The tap control value settled upon at the end of the frequency lock step need not be the tap control value corresponding to the oscillator frequency closest to the frequency of the input signal SIN. The programmable loop filter of FIG. 10 is presented as but one example of a suitable programmable loop filter. Other programmable filters are possible. A pair of CMOS transmission gates (a CMOS transmission gate involves a parallel-coupled P-channel transistor and N-channel transistor) is used as an analog multiplexer in some embodiments to selectably couple either line 102 or bias circuit 107 to programmable loop filter 105. A programmable active filter is employed in some embodiments. Accordingly, various modifications, adaptations, and combinations of various features of the described embodiments can be practiced without departing from the scope of the invention as set forth in the claims.

What is claimed is:

1. An integrated phase-locked loop circuit, comprising:
   a programmable tapped-delay-line oscillator outputting an oscillating signal SOUT, the programmable tapped-delay-line oscillator having a tap select input lead and a power input lead;
   a loop divider that generates a feedback signal SOSC from signal SOUT;
   a first phase detector having an output lead coupled to the tap select input lead of the programmable tapped-delay-line oscillator, the first phase detector outputting a digital tap control signal onto the tap select input lead of the programmable tapped-delay-line oscillator such that a frequency of signal SOSC approximates a frequency FIN of an input signal SIN in a frequency lock step; and
   a second phase detector having an output lead coupled to the power input lead of the programmable tapped-delay-line oscillator, the second phase detector controlling a supply voltage on the power input lead of the programmable tapped-delay-line oscillator such that the signal SOUT is phase locked with respect to the input signal SIN.

2. The integrated phase-locked loop circuit of claim 1, further comprising:
   a programmable loop filter that is selectably couplable to the output lead of the second phase detector.

3. The integrated phase-locked loop circuit of claim 2, further comprising:
   a bias network that is selectively couplable to the programmable loop filter, the bias network precharging a capacitance in the programmable loop filter prior to the signal SOUT being phase locked with respect to the input signal SIN.

4. The integrated phase-locked loop circuit of claim 2, further comprising:
   means for selecting one of a plurality of loop filters realizable using the programmable loop filter, the means selecting the one loop filter based at least in part on the digital tap control signal output by the first phase detector.

5. The integrated phase-locked loop circuit of claim 1, wherein the second phase detector has a gain control input lead, the phase-locked loop further comprising:
   means for selecting a gain of the second phase detector by driving a gain control signal onto the gain control input lead of the second phase detector, the means selecting the gain based at least in part on the digital tap control signal output by the first phase detector.

6. The integrated phase-locked loop circuit of claim 1, wherein the power input lead is a supply voltage input lead.

7. The integrated phase-locked loop circuit of claim 1, wherein the second phase detector outputs a reference voltage onto the power input lead during the frequency lock step, and wherein the second phase detector outputs the supply voltage onto the power input lead during a phase lock step, the frequency lock step occurring before the phase lock step.

8. The integrated phase-locked loop circuit of claim 1, wherein the programmable tapped-delay-line oscillator comprises:

a gray encoder having an input lead and a plurality of output leads, the input lead being the tap select input lead of the programmable tapped-delay-line oscillator;

a decoder having a plurality of input leads and a plurality of output leads, the plurality of input leads of the decoder being coupled to the plurality of output leads of the gray encoder;

a multiplexer having a plurality of select input leads, a plurality of data input leads, and a data output lead, the plurality of select input leads being coupled to the plurality of output leads of the decoder; and a delay line comprising a string of non-inverting buffers, the delay line having a plurality of taps, wherein the plurality of taps are coupled to the data input leads of the multiplexer, wherein at least some of the non-inverting buffers have supply voltage input leads, and wherein the power input lead of the programmable tapped-delay-line oscillator is coupled to the supply voltage input leads on the non-inverting buffers.

9. An integrated phase-locked loop circuit, comprising:

a programmable tapped-delay-line oscillator comprising a plurality of non-inverting digital logic buffers, the programmable tapped-delay-line oscillator outputting an oscillating signal SOUT, the programmable tapped-delay-line oscillator having a tap select input lead and a supply voltage input lead;

a loop divider that generates a feedback signal SOSC from signal SOUT;

a first phase detector having an output lead coupled to the tap select input lead of the programmable tapped-delay-line oscillator, the first phase detector outputting a digital tap control signal onto the tap select input lead of the programmable tapped-delay-line oscillator such that a frequency of signal SOSC approximates a frequency PIN of an input signal SIN, wherein the first phase detector changes the digital tap control signal during a first lock period, and wherein the digital tap control signal has a fixed digital value during a second lock period; and a second phase detector having an output lead coupled to the supply voltage input lead of the programmable tapped-delay-line oscillator, the second phase detector controlling a supply voltage on the supply voltage input lead during the second lock period such that the signal SOUT is phase locked with respect to the input signal SIN, the second phase detector placing a reference voltage on the supply voltage input lead during the first lock period.

10. The integrated phase-locked loop circuit of claim 9, further comprising:

a loop filter, the loop filter not being coupled to the output lead of the second phase detector during the first lock period, the loop filter being coupled to the output lead of the second phase detector during the second lock period.

11. The integrated phase-locked loop circuit of claim 9, wherein the second phase detector has a first gain during a first portion of the second lock period, and wherein the second phase detector has a second gain during a second portion of the second lock period.

12. The integrated phase-locked loop circuit of claim 9, wherein the first phase detector changes the digital tap control signal so that the frequency of the signal SOSC changes in a binary search manner during the first lock period.

13. The integrated phase-locked loop circuit of claim 9, wherein the first phase detector changes the digital tap control signal so that the frequency of the signal SOSC decreases incrementally during the first lock period.

14. The integrated phase-locked loop circuit of claim 9, wherein the first phase detector changes the digital tap control signal so that the frequency of the signal SOSC increases incrementally during the first lock period.

15. The integrated phase-locked loop circuit of claim 9, wherein the programmable tapped-delay-line oscillator has a plurality of tap select input leads, a multi-bit digital tap control value BIN being present on the plurality of tap select input leads during the second lock period, and wherein the loop divider divides by a number M, the integrated phase-locked loop circuit further comprising:

a loop filter; and means for controlling the loop filter based at least in part on the number M and the multi-bit digital tap control value BIN.

16. The integrated phase-locked loop circuit of claim 9, further comprising:

a programmable loop filter comprising a plurality of digital control input leads; and means for controlling the programmable loop filter.

17. The integrated phase-locked loop circuit of claim 16, wherein the second phase detector has a gain input lead, and wherein the means supplies a digital gain control signal onto the gain input lead of the second phase detector.

18. The integrated phase-locked loop circuit of claim 9, wherein the loop divider divides by a number M, and wherein the integrated phase-locked loop circuit can phase lock onto the input signal SIN: where oscillating signal SOUT has a frequency anywhere in the range of from 20 MHz to 400 MHz, where divider value M is an integer in the range from one to 256, and where the loop filter has a total capacitance of less than 250 picofarads.

19. The integrated phase-locked loop circuit of claim 9, further comprising:

a loop filter having a capacitance; and a precharge bias network, the capacitance of the loop filter being precharged by the precharge bias network prior to the second lock period.

20. An integrated phase-locked loop circuit having an input lead for receiving an input signal SIN, the integrated phase-locked loop circuit comprising:

a programmable tapped-delay-line oscillator;

a loop divider that receives a signal SOUT from the programmable tapped-delay-line oscillator and outputs an oscillating signal SOSC;

a first detector circuit that controls a digital tap control signal supplied to the programmable tapped-delay-line oscillator in a first lock period such that the oscillating signal SOSC output by the loop divider has a frequency that approximates a frequency of the input signal SIN;

a second detector circuit that controls a supply voltage supplied to the programmable tapped-delay-line oscillator in a second lock period such that the phase of the oscillating signal SOSC output by the loop divider is phase locked with respect to the input signal SIN; and a digitally-controlled programmable loop filter, wherein the programmable tapped-delay-line oscillator, the loop divider, the first detector circuit, the second detector circuit, and the digitally-controlled programmable loop filter are all integrated onto a single integrated circuit.

21. The integrated phase-locked loop circuit of claim 20, wherein the programmable tapped-delay-line oscillator comprises a tapped-delay-line, the tapped-delay-line being a string of digital logic inverters, wherein the loop divider divides the signal SOUT by a value M, wherein the integrated phase-locked loop circuit is part of a user-configurable device, and wherein the value M is a user-determined value for a particular user-specific application of the user-configurable device.

* * * * *